United States Patent
Kim (10) Patent No.: US 7,688,120 B2
(45) Date of Patent: Mar. 30, 2010

(54) OUTPUT DRIVER OF SEMICONDUCTOR MEMORY DEVICE

(75) Inventor: Jae-Heung Kim, Kyoungki-do (KR)

(73) Assignee: Hynix Semiconductor Inc., Kyoungki-Do (KR)

( * ) Notice: Subject to any disclaimer, the term of this patent is extended or adjusted under 35 U.S.C. 154(b) by 47 days.

(21) Appl. No.: 12/005,562

(22) Filed: Dec. 26, 2007

(65) Prior Publication Data

US 2009/0058474 A1    Mar. 5, 2009

(30) Foreign Application Priority Data

Aug. 29, 2007    (KR) ............... 10-2007-0087175

(51) Int. Cl.
    *H03B 1/00*    (2006.01)
(52) U.S. Cl. .................. 327/112; 327/108
(58) Field of Classification Search ......... 327/108–112, 327/374–377
    See application file for complete search history.

(56) References Cited

U.S. PATENT DOCUMENTS

| | | | |
|---|---|---|---|
| 5,410,189 A * | 4/1995 | Nguyen ............... | 327/374 |
| 5,877,647 A * | 3/1999 | Vajapey et al. ....... | 327/391 |
| 6,515,523 B1 * | 2/2003 | Bikulcius ............ | 327/142 |
| 7,005,910 B2 * | 2/2006 | Becker et al. ........ | 327/374 |
| 7,012,451 B2 * | 3/2006 | Srikanth et al. ...... | 327/108 |
| 7,071,761 B1 * | 7/2006 | Suzuki .............. | 327/374 |
| 7,173,470 B2 | 2/2007 | Murden et al. | |
| 7,202,702 B2 | 4/2007 | Arnold et al. | |
| 7,295,047 B2 | 11/2007 | Lee et al. | |

FOREIGN PATENT DOCUMENTS

| JP | 2005-182994 | 7/2005 |
|---|---|---|
| KR | 1998-050433 | 9/1998 |

* cited by examiner

*Primary Examiner*—Hai L Nguyen
(74) *Attorney, Agent, or Firm*—Blakely, Sokoloff, Taylor & Zafman LLP

(57) ABSTRACT

An output driver of a semiconductor memory device is capable of controlling falling and rising edges of an output data. The output driver prevents the first output data form being relatively deteriorated compared with other output data in case that the output data are terminated centering around a predetermined voltage level. The output driver includes a pull-up driver for pull-up driving an output terminal in response to a pull-up control signal, a pull-down driver for pull-down driving the output terminal in response to a pull-down control signal, a first acceleration driver for accelerating the pull-up control signal, and a second acceleration driver for accelerating the pull-down control signal, wherein the first and second acceleration drivers are activated when a first data is outputted.

12 Claims, 6 Drawing Sheets

OUTPUT DRIVER OF SEMICONDUCTOR MEMORY DEVICE

CROSS-REFERENCE TO RELATED APPLICATIONS

The present invention claims priority to Korean patent application number 10-2007-0087175 filed on Aug. 29, 2007, which is incorporated by reference in its entirety.

BACKGROUND OF THE INVENTION

The present invention relates to semiconductor design technology, and more particularly to an output driver of a semiconductor memory device.

In general, semiconductor memory devices such as a dynamic random access memory (DRAM) select one of a plurality of cell capacitors according to X and Y address signals inputted from the outside. And then, the semiconductor memory devices amplify a voltage level corresponding to charges stored in the selected cell capacitor and transfer the amplified voltage level to the outside as an output data in a read operation. On the contrary, in a write operation, the semiconductor memory devices store a voltage level corresponding to an input data in the selected cell capacitor in the form of charges, wherein the input data is provided from the outside simultaneously with X and Y address signals.

The semiconductor memory devices include a variety of paths and circuits in order to quickly access a desired cell among the plurality of cell capacitors and amplify a fine signal of the accessed cell accurately and quickly. For example, the semiconductor memory devices need an output driver for processing a data DQ and a data strobe DQS as a main data output driver is needed for transferring an amplified signal from a memory cell to global I/O (GIO) line at a read operation.

Figure 1:
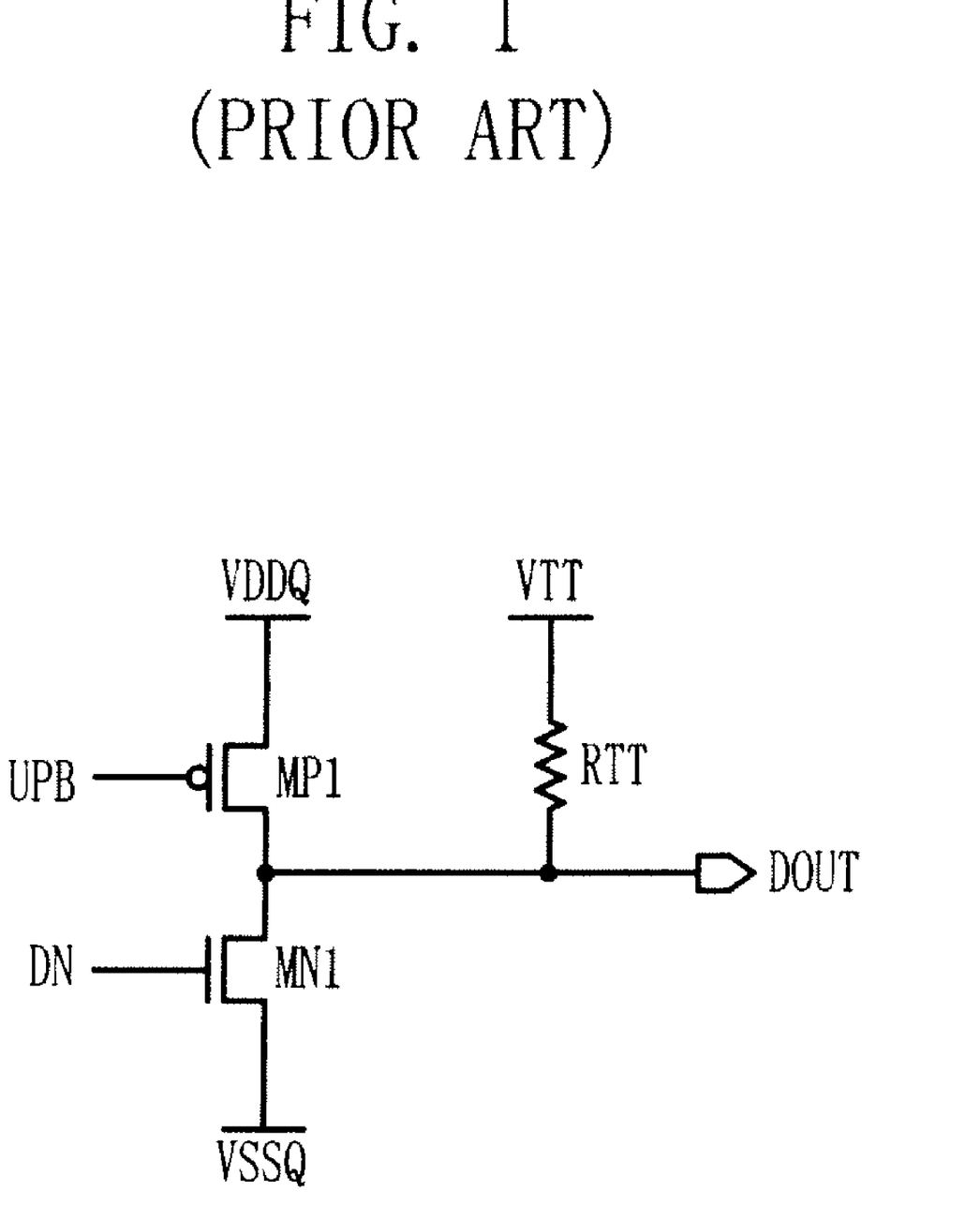
FIG. 1 illustrates a schematic circuit diagram of a conventional output driver in a semiconductor memory device.

FIG. 1 illustrates a schematic circuit diagram of a conventional output driver in a semiconductor memory device. The output driver is used for processing an internal data at a read operation.

Referring to FIG. 1, the output driver is provided with two output driving element for outputting a data DQ which is read from a cell. A first output driving element including a PMOS transistor MP1 is a kind of pull-up driver for outputting a high level of data in a pull-up method. A second output driving element including a NMOS transistor MN1 is a kind of pull-down driver for outputting a low level of data in a pull-down method.

Not shown in FIG. 1, pull-up and pull-down pre-driving elements are further provided. The pull-up pre-driving element is provided for driving the first output driving element and the pull-down pre-driving element is provided for driving the second output driving element.

The output driver configured as the above-mentioned includes the first and second output driving elements in a kind of inverter form, but having different input signals. A supply voltage level terminal VDDQ and a ground voltage level terminal VSSQ defined for an output on JEDEC spec are used.

Figure 2:
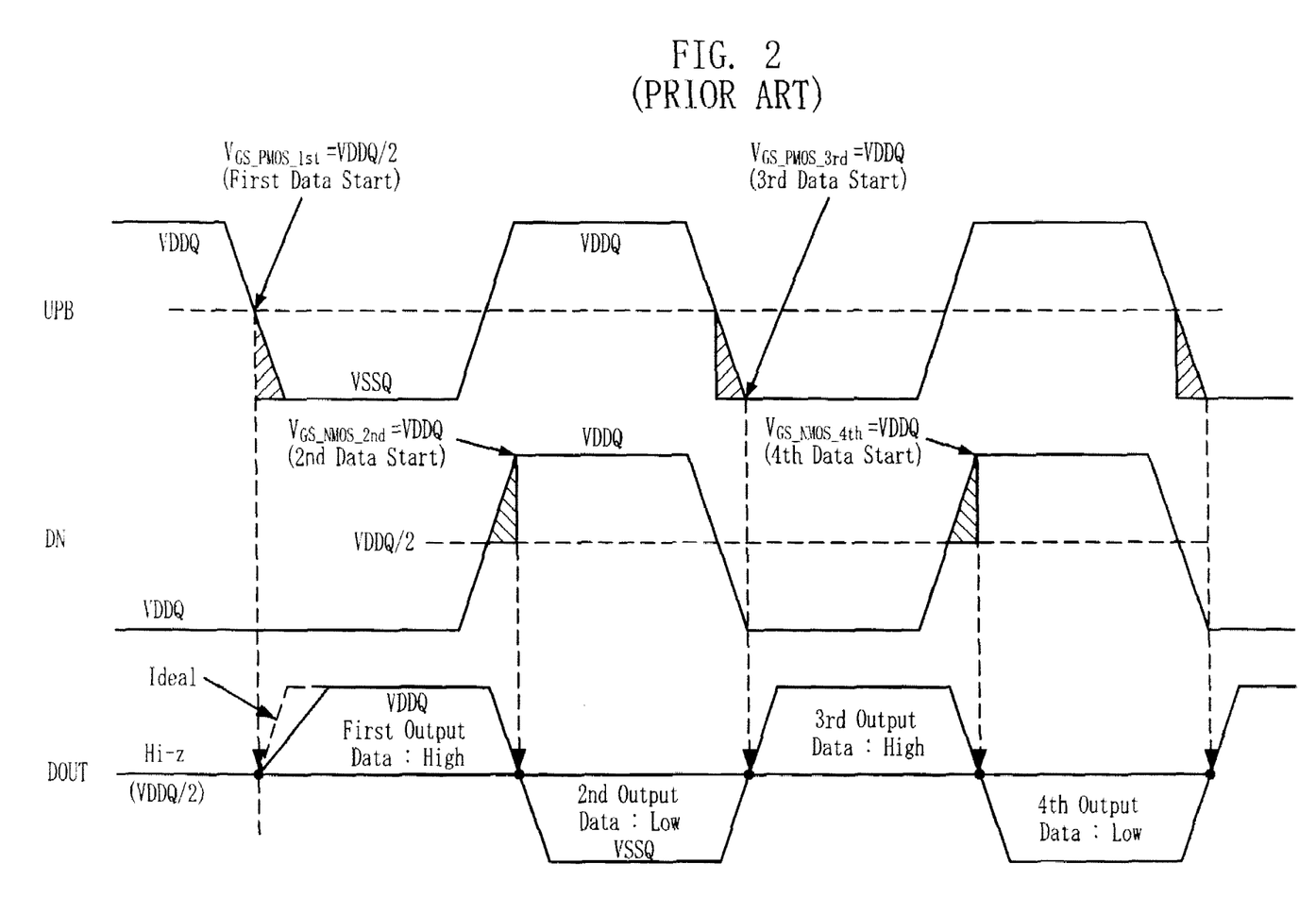
FIG. 2 illustrates a signal timing diagram of an output of the conventional output driver.

At an interface terminal between a main memory of the DRAM and a chip set, voltage level swings range from a low level to a high level centering around a termination voltage level VTT which is a half of a supply voltage level VDDQ/2. Accordingly, in case that the output driver is used in the main memory, an output data DOUT is outputted as low or high data centering around the termination voltage level VTT, referring to FIG. 2. FIG. 2 illustrates a signal timing diagram of an output of the conventional output driver.

For driving the output driver operating as describe above, a general inverter is used which swings from the ground voltage level VSSQ to the supply voltage level VDDQ fully as a pre-driver. In this case, there is a problem such that a first output date is deteriorated.

Referring to FIG. 2, it is clearly confirmed by comparing a starting point of the first output data with that of a second to a fourth output data. Comparing a gate voltage of the PMOS transistor MP1 or the NMOS transistor MN1 when the output data DOUT is in the termination voltage level VTT, the gate voltage of the PMOS transistor MP1 is the half of the supply voltage level VDDQ/2 at the starting point of the first output data, however, at the starting point of the second to fourth output data, the supply or ground voltage level VDDQ or VSSQ is supplied to a gate of the PMOS transistor MP1. The voltage difference causes a current difference of the output driver.

In addition, if it is assumed that a threshold voltage of the PMOS and NMOS transistor MP1 and MN1 should be half the supply voltage level VDDQ/2, a first data eye is reduced due to deterioration in a slew rate or a duty cycle, comparing the other. The reason that the slew rate or duty cycle is deteriorated is that the first output data is processed when the PMOS transistor MP1 begin to turn on. Comparing with the first output data, the second to fourth output data are processed after the PMOS and NMOS transistors MP1 and MN1 fully turn on because the supply or ground voltage level VDDQ or VSSQ is supplied to each transistor at the starting point of each output data.

SUMMARY OF THE INVENTION

Embodiments of the present invention are directed to providing an output driver of a semiconductor memory device being capable of controlling falling and rising edges of an output data. The output driver prevents the first output data form being relatively deteriorated compared with other output data in case that the output data are terminated centering around a predetermined voltage level. In addition, in case that the input voltage level of the output driver fully swings form a supply voltage level to a ground voltage level, the output driver of the present invention can stably output all output data as well as a first output data, by preventing the first output date form being deteriorated.

In one embodiment, an output driver of a semiconductor memory device includes a pull-up driver for pull-up driving an output terminal in response to a pull-up control signal, a pull-down driver for pull-down driving the output terminal in response to a pull-down control signal, a first acceleration driver for accelerating the pull-up control signal, and a second acceleration driver for accelerating the pull-down control signal, wherein the first and second acceleration drivers are activated when a first data is outputted.

In another embodiment, an output driver of a semiconductor memory device includes a pull-up driver for pull-up driving an output terminal in response to a pull-up control bar signal, a pull-down driver for pull-down driving the output terminal in response to a pull-down control signal, first and second pre-drivers for outputting the pull-up control bar signal and the pull-down control signal respectively, wherein the pull-up control bar signal and the pull-down control signal fully swing from a supply voltage level to a ground voltage level, a first acceleration driver for accelerating the pull-up control bar signal by being associated with the second pre-driver when the first pre-driver is activated to output a first data, and a second acceleration driver for accelerating the pull-down control signal by being associated with the first pre-driver when the second pre-driver is activated to output a first data, wherein the first and second acceleration driver are connected between output terminals of the first and second pre-drivers.

In further embodiment, an output driver of a semiconductor memory device includes a pre-driver for outputting a control signal, the control signal fully swinging from a supply voltage level to a ground voltage level, a main driver for outputting data in response to the control signal, and a acceleration driver for accelerating the control signal when a first data is outputted.

DESCRIPTION OF SPECIFIC EMBODIMENTS

Hereinafter, an output driver of a semiconductor memory device in accordance with the present invention will be described in detail with reference to the accompanying drawings.

Figure 3:
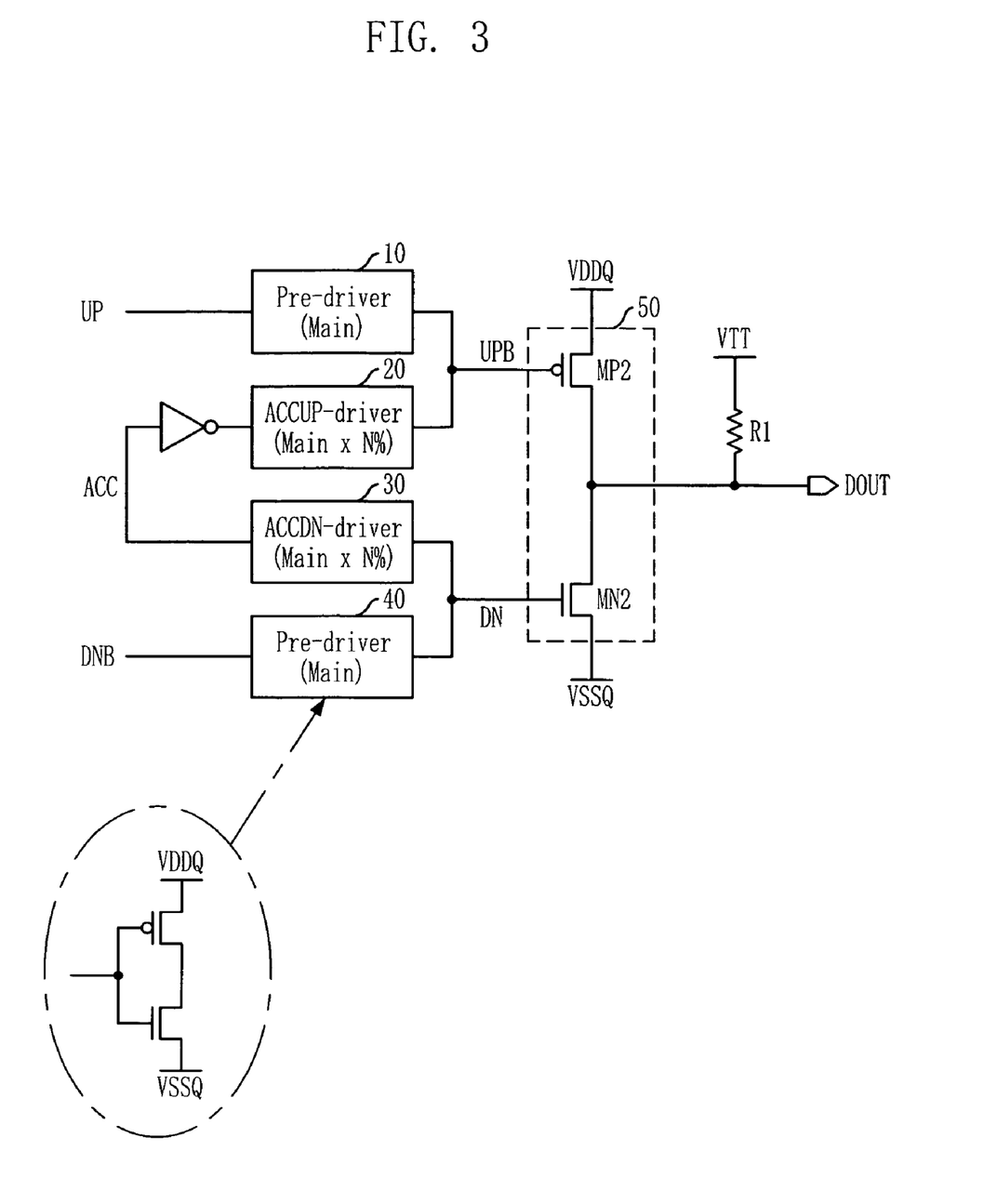
FIG. 3 illustrates a block diagram of an output driver of a semiconductor memory device in accordance with an embodiment of the present invention.

FIG. 3 illustrates a block diagram of an output driver of a semiconductor memory device in accordance with an embodiment of the present invention.

The output driver includes a first pre driver 10 configured in pull-up form, a second pre driver 40 configured in pull-down form, and a main output driver 50 driven by the first and second pre drivers 10 and 40 for outputting data. As shown in FIG. 3, the first and second pre drivers 10 and 40 includes PMOS and NMOS transistors between supply and ground voltage terminals VDDQ and VSSQ as a kind of inverter.

The main output driver 50 includes a pull-up output driver and a pull-down output driver. The pull-up output driver includes a PMOS transistor MP2 which receives a pull-up bar signal UPB outputted from the first pre driver 10 through a gate and has a source connected to the supply voltage terminal VDDQ and a drain outputting an output data DOUT. The pull-down output driver includes a NMOS transistor MPN2 which receives a pull-down signal DN outputted from the second pre driver 20 through a gate and has a source connected to the ground voltage terminal VSSQ and a drain outputting an output data DOUT.

The output driver in accordance with the present invention further includes first and second acceleration drivers 20 and 30 for accelerating a data process at rising or falling edge of a first output data DOUT.

The first acceleration driver 20 controls an input signal of the pull-up output driver, i.e., the PMOS transistor MP2. When the first output data DOUT is in a logic high level, the first acceleration driver 20 accelerates a rising edge time of the output data DOUT. The second acceleration driver 30 controls an input signal of the pull-down output driver, i.e., the NMOS transistor MN2. When the first output data DOUT is in a logic low level, the first acceleration driver 20 accelerates a falling edge time of the output data DOUT. Control signals of the first and second acceleration drivers 20 and 30 have an inverted state relative to each other by an inverter.

An operation of the output driver of the semiconductor memory device in accordance with the embodiment of the present invention will be described below.

When a pull-up signal UP for driving the first pre driver 10 is in a logic low level, a PMOS transistor turns on and a NMOS transistor turns off in the first pre driver 10. Accordingly, the pull-up bar signal UPB maintains a logic high level. Subsequently if the pull-up signal UP is activated form a logic low level to a logic high level, the PMOS transistor turns off and the NMOS transistor turns on. The pull-up bar signal UPB is activated in a logic low level by a current path extended through the NMOS transistor to the ground voltage terminal VSSQ.

Similarly, when a pull-down bar signal DNB for driving the second pre driver 40 is in a logic low level, a PMOS transistor turns on and a NMOS transistor turns off in the second pre driver 40. Accordingly, the pull-down signal DN maintains a logic high level. Subsequently if the pull-down bar signal DNB is activated form a logic low level to a logic high level, the PMOS transistor turns off and the NMOS transistor turns on. The pull-down signal DN is activated in a logic low level by a current path extended through the NMOS transistor to the ground voltage terminal VSSQ.

In addition, the main output driver 50 is driven by the pull-up bar signal UPB of the first pre driver 10 and the pull-down signal DN of the second pre driver 40. Accordingly, centering around the termination voltage level VDDQ/2, a high level of signal is outputted through the pull-up output driver MP2 and a low level of signal is outputted through the pull-down output driver MN2.

Meanwhile, it is necessary that input signals of the pull-up and pull-down output drivers MP2 and MN2 should be controlled before an operation for outputting the first output data.

That is, if the first output data DOUT is outputted in a logic high level, the first acceleration driver 20 accelerates a falling time of the pull-up bar signal UPB outputted from the first pre driver 10 by N times in the rising edge period of the first output data DOUT.

Under the circumstance, the period such that the pull-up and pull-down output drivers MP2 and MN2 of the main output driver 50 are supplied with half of a supply voltage level VDDQ/2 as a gate input at an output of the first output data is cut short. Processing the first output data is controlled, referring to FIG. 4, and the process conditions of the first output data become similar to that of the others.

In addition, if the first output data DOUT is outputted in a logic low level, the second acceleration driver 30 accelerates a rising time of the pull-down signal DN outputted from the second pre driver 40 by N times in the falling edge period of the first output data DOUT.

After that, the first and second acceleration drivers 20 and 30 shut off when the first and second pre drivers 10 and 40 operate normally. The main output driver 50 is controlled only by the first and second pre drivers 10 and 40.

Figure 5:
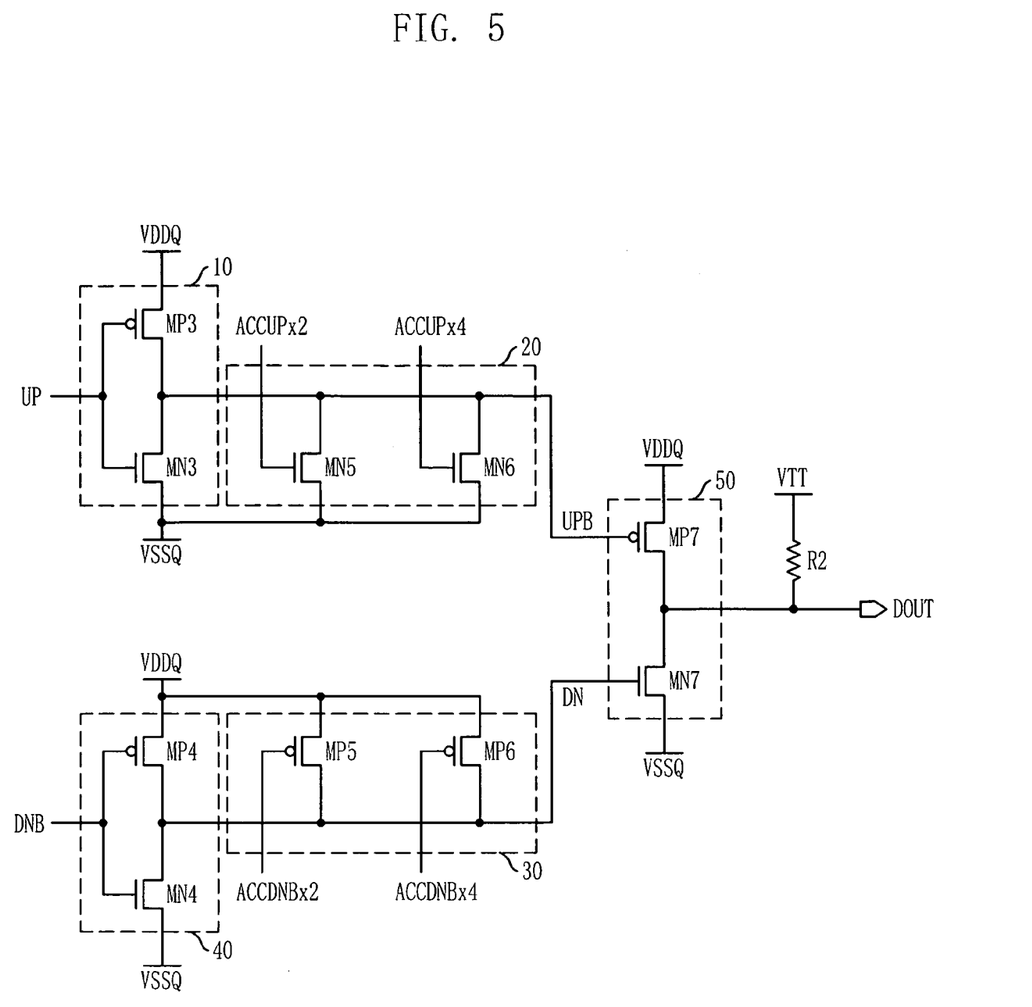
FIG. 5 illustrates a schematic circuit diagram of an output driver of a semiconductor memory device in accordance with a first embodiment of the present invention.

FIG. 5 illustrates a schematic circuit diagram of an output driver of a semiconductor memory device in accordance with a first embodiment of the present invention.

The output driver includes a first pre driver 10 configured in pull-up form, a first acceleration driver 20 for accelerating an output signal of the first pre driver 10, a second pre driver 40 configured in pull-down form, a second acceleration driver 30 for accelerating an output signal of the second pre driver 40, and a main output driver 50 for outputting a low/high signal centering around a half of supply voltage level VDDQ/2.

The first pre driver 10 includes PMOS and NMOS transistors MP3 and MN3 having an inverter configuration connected in series between supply and ground voltage terminals VDDQ and VSSQ. The PMOS and NMOS transistors MP3 receive a pull-up signal UP through a gate. An output of the first pre driver 10, i.e., a pull-up bar signal UPB is inputted to a gate of a pull-up output driver provided in the main output driver 50. Herein, the pull-up output driver includes a PMOS transistor MP7 having a source connected to the supply voltage terminal VDDQ and a drain for outputting an output data DOUT.

The first acceleration driver 20 includes two NMOS transistors MN5 and MN6. A first NMOS transistor MN5 has a source connected to the ground voltage terminal VSSQ and a drain connected to the gate of the pull-up output driver of the main output driver 50, which gate receives a twice accelerating signal ACCUP×2. A second NMOS transistor MN6 has a source connected to the ground voltage terminal VSSQ and a drain connected to the gate of the pull-up output driver of the main output driver 50, which receives a four times accelerating signal ACCUP×4 through its gate. The first acceleration driver 20 may includes more transistors for the acceleration within a size allowed in a memory device The second pre driver 40 includes PMOS and NMOS transistors MP4 and MN4 having an inverter configuration connected in series between supply and ground voltage terminals VDDQ and VSSQ. The PMOS and NMOS transistors MP3 receive a pull-down bar signal DNB through a gate. An output of the second pre driver 40, i.e., a pull-down signal DN is inputted to a gate of a pull-down output driver provided in the main output driver 50. Herein, the pull-down output driver includes a NMOS transistor MN7 having a source connected to the ground voltage terminal VSSQ and a drain for outputting an output data DOUT.

The second acceleration driver 30 includes two PMOS transistors MP5 and MP6. A first PMOS transistor MP5 has a source connected to the supply voltage terminal VDDQ and a drain connected to the gate of the pull-down output driver of the main output driver 50, which receives a twice accelerating signal ACCDNB×2 through its gate. A second PMOS transistor MP6 has a source connected to the supply voltage terminal VDDQ and a drain connected to the gate of the pull-down output driver of the main output driver 50, which receives a four times accelerating signal ACCDNB×4 through its gate. The second acceleration driver 30 may also include more transistors for the acceleration within a size allowed in the memory device An operation of the output driver configured as the above-mentioned in accordance with the present invention will be described below.

When a pull-up signal UP for driving the first pre driver 10 is in a logic low level, the PMOS transistor MP3 turns on and the NMOS transistor MN3 turns off in the first pre driver 10. Accordingly, the pull-up bar signal UPB maintains a logic high level. Subsequently if the pull-up signal UP is activated form a logic low level to a logic high level, the PMOS transistor MP3 turns off and the NMOS transistor MN3 turns on. The pull-up bar signal UPB is activated in a logic low level by a current path extended through the NMOS transistor MN3 to the ground voltage terminal VSSQ.

Similarly, when a pull-down bar signal DNB for driving the second pre driver 40 is in a logic low level, the PMOS transistor MP4 turns on and the NMOS transistor MN4 turns off in the second pre driver 40. Accordingly, the pull-down signal DN maintains a logic high level. Subsequently if the pull-down bar signal DNB is activated from a logic low level to a logic high level, the PMOS transistor MP4 turns off and the NMOS transistor MN4 turns on. The pull-down signal DN is activated in a logic low level by a current path extended through the NMOS transistor MN4 to the ground voltage terminal VSSQ.

In addition, the main output driver 50 is driven by the pull-up bar signal UPB of the first pre driver 10 and the pull-down signal DN of the second pre driver 40. Accordingly, centering around the termination voltage level VDDQ/2, a high level of signal is outputted through the pull-up output driver and a low level of signal is outputted through the pull-down output driver.

Meanwhile, when the output driver outputs the first output data DOUT in a logic high level, the first acceleration driver 20 operates together with the first pre driver 10. For example, when it is required to be accelerated twice, the twice accelerating signal ACCUP×2 is inputted in a logic high level and the transistor MN5 turns on. Because the transistor MN5 turns on as well as the transistor MN3 does for outputting the first output data DOUT in a logic high level, the pull-up bar signal UPB decreases to the ground voltage level VSSQ faster. That is, the first acceleration driver 20 operating additionally, the pull-up bar signal UPB is activated in a logic low level twice as fast when the first pre driver 10 operates alone.

In addition, when it is required to be accelerated four times, the four times accelerating signal ACCUP×4 is inputted in a logic high level and the transistor MN6 turns on. Accordingly, the first acceleration driver 20 operates additionally and the pull-up bar signal UPB is activated in a logic low level four times faster than when the first pre driver 10 operates only.

Accelerating twice or four times by the first acceleration driver 20 is controlled by channel widths, i.e., resistance values, of the transistors MN5 and MN6.

Figure 4:
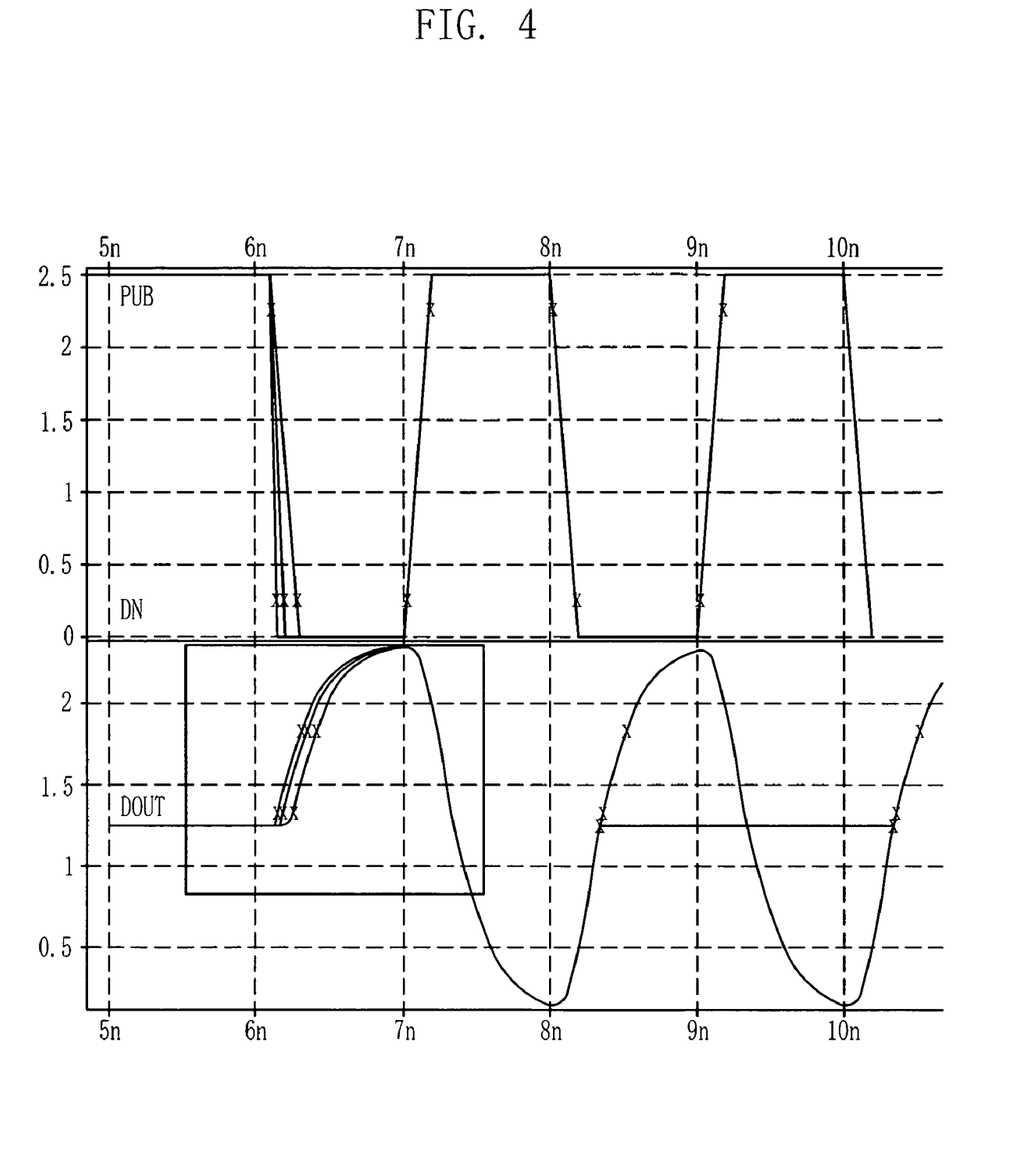
FIG. 4 illustrates a simulation diagram of an output of the output driver in accordance with the present invention.

As described above, when the output driver outputs the first output data DOUT in a logic high level, a falling time of an input signal (the pull-up bar signal UPB) of the pull-up output driver is accelerated to be faster than a conventional operation. Accordingly, the acceleration may compensate for deterioration in a rising edge period of the first output data as shown in FIG. 4.

When the output driver outputs the first output data DOUT in a logic low level, the second acceleration driver 30 operates together with the second pre driver 40 for controlling a falling edge period of the output data DOUT. For example, when it is required to be accelerated twice, the twice accelerating signal ACCDNB×2 is inputted in a logic low level and the transistor MP5 turns on. Because the transistor MP5 turns on as well as the transistor MP4 does for outputting the first output data DOUT in a logic low level, the pull-down signal DN decrease to the ground voltage level VSSQ faster. That is, the second acceleration driver 30 operating additionally, the pull-down signal DN is activated in a logic high level twice as fast when the second pre driver 40 operates alone.

In addition, when it is required to be accelerated four times, the four times accelerating signal ACCDNB×4 is inputted in a logic low level and the transistor MP6 turns on. Accordingly, the second acceleration driver 30 operates additionally and the pull-down signal DN is activated in a logic high level four times faster than when the second pre driver 40 operates only.

Accelerating twice or four times by the second acceleration driver 30 is controlled by channel widths, i.e., resistance values, of the transistors MP5 and MP6.

As described above, in a falling edge period of the first output data having a logic low level, a rising time of an input signal (the pull-down signal DN of the pull-down output driver is accelerated to be faster than a conventional operation. Accordingly, the output driver can compensate for deterioration in the falling edge period of the first output data.

Figure 6:
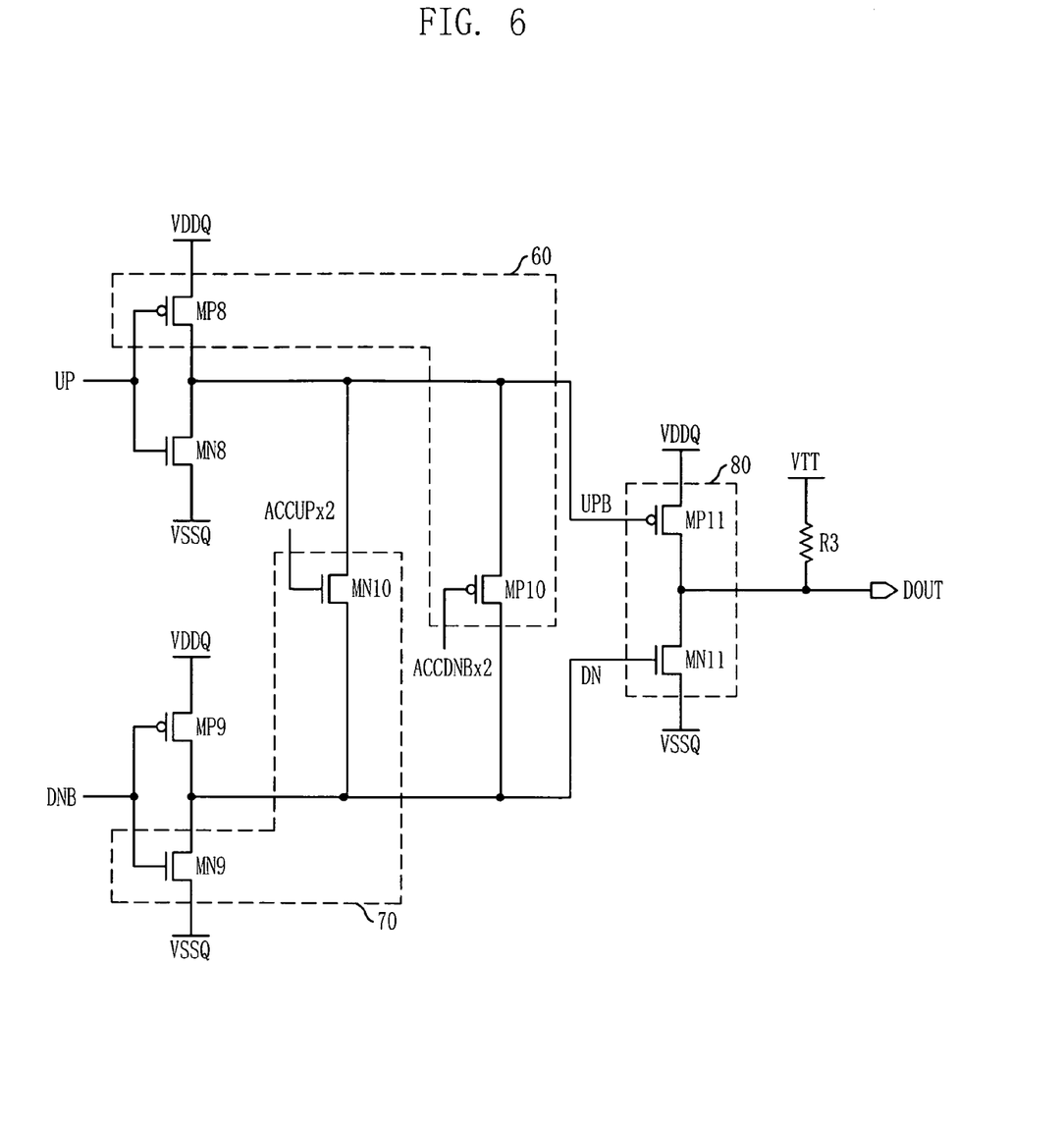
FIG. 6 illustrates a schematic circuit diagram of an output driver of a semiconductor memory device in accordance with a second embodiment of the present invention.

FIG. 6 illustrates a schematic circuit diagram of an output driver of a semiconductor memory device in accordance with a second embodiment of the present invention.

In the embodiment, an acceleration driver is associated with a pre driver, thereby providing a variety of acceleration rates. In addition, it is possible to embody the acceleration driver in a semiconductor memory device easily, even if it is restricted to configure the acceleration driver with respect to a space or a size within the semiconductor memory device.

Referring to FIG. 6, the case of accelerating twice is embodied. A first pre driver including a PMOS transistor MP8 and NMOS transistor MN8 shares a part of structure with a second acceleration driver which operates in a falling edge period of a first output data having a logic low level.

That is, the first pre driver has an inverter structure such that the PMOS transistor MP8 and the NMOS transistor MN8 are connected in series between a supply voltage terminal VDDQ and a ground voltage terminal VSSQ. A pull-up signal UP is inputted to both gates of the PMOS transistor MP8 and the NMOS transistor MN8. The first pre driver outputs a pull-up bar signal UPB to a pull-up output driver provided in a main output driver 80. The pull-up output driver includes a PMOS transistor MP11, which has a source connected to the supply voltage terminal VDDQ, outputting an output data DOUT through a drain in response to the pull-up bar signal UPB inputted through a gate.

A PMOS transistor MP10 is configured between output terminals of the first pre driver and a second pre driver mentioned later. The PMOS transistor MP10 operates with the PMOS transistor MP8 as the second acceleration driver 60. The PMOS transistor MP10 receives a twice accelerating signal ACCDNB×2 through a gate and its channel width is controlled. Therefore, the pull-up bar signal UPB is accelerated.

In addition, a second pre driver including a PMOS transistor MP9 and NMOS transistor MN9 shares a part of structure with a first acceleration driver which operates in a rising edge period of the first output data having a logic high level.

That is, the second pre driver has an inverter structure such that the PMOS transistor MP9 and the NMOS transistor MN9 are connected in series between a supply voltage terminal VDDQ and a ground voltage terminal VSSQ. A pull-down bar signal DNB is inputted to both gates of the PMOS transistor MP9 and the NMOS transistor MN9. The second pre driver outputs a pull-down signal DN to a pull-down output driver provided in a main output driver 80. The pull-down output driver includes a NMOS transistor MN11, which includes a source connected to the ground voltage terminal VSS, outputting an output data DOUT through a drain in response to the pull-down signal DN inputted through a gate.

A NMOS transistor MN10 also is configured between the output terminals of the first pre driver and a second pre driver. The NMOS transistor MN10 operates with the NMOS transistor MN9 as the first acceleration driver 70. The NMOS transistor MN10 receives a twice accelerating signal ACCUP×2 through a gate and its channel width is controlled. Therefore, the pull-down signal DN is accelerated.

As for an operation of the output driver configured as the above-mentioned, when the output driver outputs the first output data in a logic high level, the pull-up signal UP and the pull-down bar signal are inputted in a logic high level. The first pre driver outputs the pull-up bar signal UPB having a logic low level in response to the logic high logic level of pull-up signal UP. In response to the logic low level of pull-up bar signal UPB, the pull-up output driver outputs the output data DOUT in a logic high level.

In addition, in response to the logic high level of pull-down bar signal DNB, the NMOS transistor MN9 of the second pre driver turns on. However, an output of the second pre driver dose not make the NMOS transistor MN11 of the main output driver 80 turn on. Accordingly the output data DOUT maintains a logic high level based on the operation of the first pre driver.

Meanwhile, when the first output data is outputted, the first and second acceleration drivers 70 and 60 receives an input signal in a logic high level. That is, the twice accelerating signals ACCUP×2 and ACCDNB×2 are inputted in a logic high level. In response to the logic high level of twice accelerating signals ACCUP×2 and ACCDNB×2, the NMOS transistor MN10 of the first acceleration driver 70 turns on and the PMOS transistor MP10 of the second acceleration driver 60 turns off.

When the NMOS transistor MN10 turns on, a current path is formed from an output terminal of the first pre driver to the ground voltage terminal VSSQ through the NMOS transistor MN10 and the NMOS transistor MN9 of the second pre driver because the NMOS transistor MN9 maintains a turn on state. Accordingly, a falling time of the pull-up bar signal UPB is accelerated twice. The period such that the PMOS transistor MP11 of the main output driver 80 are supplied with a half of supply voltage level VDDQ/2 is cut short, which compensates for deterioration in a rising edge period of the first output data.

Likewise, when the output driver outputs the first output data in a logic high level, the pull-up signal UP and the pull-down bar signal are inputted in a logic low level. The second pre driver outputs the pull-down signal DN having a logic high level in response to the logic low logic level of pull-down bar signal DN. In response to the logic high level of pull-down signal DN, the pull-down output driver outputs the output data DOUT in a logic low level.

In addition, in response to the logic low level of pull-up signal UP, the NMOS transistor MN8 of the first pre driver turns on. However, an output of the first pre driver dose not make the PMOS transistor MP11 of the main output driver 80 turn on. Accordingly the output data DOUT maintains a logic low level based on the operation of the second pre driver.

Meanwhile, when the first output data is outputted in a logic high level, the first and second acceleration drivers 70 and 60 receives an input signal in a logic low level. That is, the twice accelerating signals ACCUP×2 and ACCDNB×2 are inputted in a logic low level. In response to the logic low level of twice accelerating signals ACCUP×2 and ACCDNB×2, the NMOS transistor MN10 of the first acceleration driver 70 turns off and the PMOS transistor MP10 of the second acceleration driver 60 turns on.

When the PMOS transistor MP10 turns on, a current path is formed from an output terminal of the second pre driver to the supply voltage terminal VDDQ through the PMOS transistor MP10 and the PMOS transistor MP8 of the first pre driver because the PMOS transistor MP8 maintains a turn on state. Accordingly, a rising time of the pull-down signal DN is accelerated twice. The period such that the NMOS transistor MN11 of the main output driver 80 are supplied with a half of supply voltage level VDDQ/2 is cut short, which compensates for deterioration in a falling edge period of the first output data.

As described above, the output driver of the semiconductor memory device in accordance with present invention prevents the first output data from being relatively deteriorated compared with other output data when the input voltage level of the output driver fully swings from the supply voltage level to the ground voltage level. The output driver accelerates a rising time or a falling time of output signals of the pre driver. Accordingly, it is controlled that all output data as well as the first output data are processed under the same circumstance, i.e., stable circumstance. The slew rate and duty cycle of the first output data is improved.

The above output driver is described as one of preferred embodiments. However, it is possible that the present invention should be applied to any case in order for the first output date to be prevented from being deteriorated in the structure including the output driver which of an output level is terminated to a predetermined level and an input level fully swing within a predetermined range.

While the present invention has been described with respect to the specific embodiments, it will be apparent to those skilled in the art that various changes and modifications may be made without departing from the spirit and scope of the invention as defined in the following claims.

What is claimed is:

1. An output driver of a semiconductor memory device, comprising:
    a pull-up driver for pull-up driving an output terminal in response to a pull-up control signal;
    a pull-down driver for pull-down driving the output terminal in response to a pull-down control signal;
    a first acceleration driver for accelerating the pull-up control signal by being associated with a second pre-driver when a first pre-driver is activated to output a first data;
    a second acceleration driver for accelerating the pull-down control signal by being associated with the first pre-driver when the second pre-driver is activated to output the first data;
    the first pre-driver for outputting the pull-up control signal, wherein the pull-up control signal fully swings from a supply voltage level to a ground voltage level in response to a pull-up signal; and
    the second pre-driver for outputting the pull-down control signal fully, wherein the pull-up control signal swings from the supply voltage level to the ground voltage level in response to a pull-down signal,
    wherein the first and second acceleration drivers are activated when the first data is outputted.

2. The output driver as recited in claim 1, wherein the pull-up driver includes a PMOS transistor and the pull-down driver includes an NMOS transistor.

3. The output driver as recited in claim 1, wherein the first acceleration driver is connected to an output terminal of the first pre-driver and accelerates the pull-up control signal by N times during the activation of the first pre-driver in response to an external control signal, N being a positive integer.

4. The output driver as recited in claim 3, wherein the first acceleration driver accelerates a falling time of the pull-up control signal.

5. The output driver as recited in claim 4, wherein the first acceleration driver includes a plurality of NMOS transistors which have different channel widths and are connected in parallel between the output terminal of the first pre-driver and a ground voltage terminal, the NMOS transistors operating selectively.

6. The output driver as recited in claim 1, wherein the second acceleration driver is connected to an output terminal of the second pre-driver and accelerates the pull-down control signal by N times during the activation of the second pre-driver in response to an external control signal, N being a positive integer.

7. The output driver as recited in claim 6, wherein the second acceleration driver accelerates a rising time of the pull-down control signal.

8. The output driver as recited in claim 7, wherein the second acceleration driver includes a plurality of PMOS transistors which have different channel widths and are connected in parallel between the output terminal of the second pre-driver and a supply voltage terminal, the PMOS transistors operating selectively.

9. An output driver of a semiconductor memory device, comprising:
    a pull-up driver for pull-up driving an output terminal in response to a pull-up control bar signal;
    a pull-down driver for pull-down driving the output terminal in response to a pull-down control signal;
    first and second pre-drivers for outputting the pull-up control bar signal and the pull-down control signal respectively, wherein the pull-up control bar signal and the pull-down control signal fully swing from a supply voltage level to a ground voltage level;
    a first acceleration driver for accelerating the pull-up control bar signal by being associated with the second pre-driver when the first pre-driver is activated to output a first data; and
    a second acceleration driver for accelerating the pull-down control signal by being associated with the first pre-driver when the second pre-driver is activated to output a first data,
    wherein the first and second acceleration driver are connected between output terminals of the first and second pre-drivers.

10. The output driver as recited in claim 9, wherein the first and second pre-drivers receive a pull-up control signal and a pull-down control bar signal respectively, and each of the pre-drivers includes a PMOS transistor and an NMOS transistor connected in series between a supply voltage terminal and a ground voltage terminal.

11. The output driver as recited in claim 10, wherein the second acceleration driver includes PMOS transistors and accelerates the pull-down control signal by being associated with the PMOS transistor of the first pre-driver which is connected to the supply voltage terminal during the activation of the second pre-driver.

12. The output driver as recited in claim 10, wherein the first acceleration driver includes NMOS transistors and accelerates the pull-up control bar signal by being associated with the NMOS transistor of the second pre-driver which is connected to the ground voltage terminal during the activation of the first pre-driver.

* * * * *